(12) United States Patent
Chen et al.

(10) Patent No.: US 11,398,380 B2
(45) Date of Patent: Jul. 26, 2022

(54) METHOD AND STRUCTURE OF MIDDLE LAYER REMOVAL

(71) Applicant: Taiwan Semiconductor Manufacturing Co., Ltd., Hsinchu (TW)

(72) Inventors: Nai-Chia Chen, Hsinchu (TW); Wan Hsuan Hsu, Taoyuan (TW); Chia-Wei Wu, Miaoli County (TW); Neng-Jye Yang, Hsinchu (TW); Chun-Li Chou, Jhubei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 127 days.

(21) Appl. No.: 16/869,859

(22) Filed: May 8, 2020

(65) Prior Publication Data

US 2020/0266065 A1 Aug. 20, 2020

Related U.S. Application Data

(63) Continuation of application No. 16/104,637, filed on Aug. 17, 2018, now Pat. No. 10,658,179.

(51) Int. Cl.
| | |
|---|---|
| *H01L 21/033* | (2006.01) |
| *H01L 21/02* | (2006.01) |
| *H01L 21/311* | (2006.01) |
| *H01L 21/027* | (2006.01) |
| *H01L 21/3213* | (2006.01) |

(52) U.S. Cl.
CPC ...... *H01L 21/0337* (2013.01); *H01L 21/0206* (2013.01); *H01L 21/0332* (2013.01); *H01L 21/0335* (2013.01); *H01L 21/0338* (2013.01); *H01L 21/0273* (2013.01); *H01L 21/31111* (2013.01); *H01L 21/31122* (2013.01); *H01L 21/31138* (2013.01); *H01L 21/32137* (2013.01)

(58) Field of Classification Search
None
See application file for complete search history.

(56) References Cited

U.S. PATENT DOCUMENTS

| | | | |
|---|---|---|---|
| 8,846,534 B1* | 9/2014 | Li | G11B 5/3163 438/959 |
| 9,653,348 B1* | 5/2017 | Wu | H01L 23/53295 |
| 2010/0068656 A1* | 3/2010 | Yeh | H01L 21/3086 430/323 |
| 2012/0028477 A1* | 2/2012 | Lee | H01L 21/76816 257/E21.259 |

(Continued)

*Primary Examiner* — Khaja Ahmad
(74) *Attorney, Agent, or Firm* — Birch, Stewart, Kolasch & Birch, LLP

(57) ABSTRACT

A middle layer removal method is provided. The method includes providing a substrate having a structure formed on the substrate, and forming a spacer layer on the structure. The method includes forming a mask layer over the spacer layer, the mask layer including a first layer, a second layer over the first layer, and a third layer over the second layer. The method also includes patterning the third layer of the mask layer, and etching the first layer and the second layer of the mask layer to form an opening to expose a bottom surface of the second layer. The method further includes removing the second layer using a wet etchant.

20 Claims, 9 Drawing Sheets

(56) References Cited

U.S. PATENT DOCUMENTS

| | | | |
|---|---|---|---|
| 2012/0309189 A1* | 12/2012 | Park | H01L 21/76811 438/643 |
| 2013/0284209 A1* | 10/2013 | Kim | H01L 21/67028 134/19 |
| 2015/0147886 A1* | 5/2015 | Tung | H01L 21/0338 438/696 |
| 2015/0155171 A1* | 6/2015 | Chang | H01L 21/0337 438/703 |
| 2015/0262912 A1 | 9/2015 | Ting | |
| 2016/0064239 A1 | 3/2016 | Shih et al. | |
| 2016/0181103 A1 | 6/2016 | He | |
| 2016/0211174 A1* | 7/2016 | Singh | H01L 21/76807 |
| 2016/0372334 A1 | 12/2016 | Mignot et al. | |
| 2017/0372909 A1 | 12/2017 | Briggs et al. | |

* cited by examiner

METHOD AND STRUCTURE OF MIDDLE LAYER REMOVAL

PRIORITY CLAIM AND CROSS-REFERENCE

This application is a Continuation application of U.S. patent application Ser. No. 16/104,637, filed on Aug. 17, 2018, the entire of which is incorporated by reference herein.

BACKGROUND

With the increasing down-scaling of semiconductor devices, various processing techniques, such as, photolithography, and the like are adapted to allow for the manufacture of devices with increasingly smaller dimensions. However, as semiconductor processes require smaller process windows, the manufacture of these devices have approached and even surpassed the theoretical limits of photolithography equipment. As semiconductor devices continue to shrink, the spacing desired between elements (i.e., the pitch) of a device is less than the pitch that can be manufactured using traditional optical masks and photolithography equipment.

One approach used to achieve the higher resolutions to manufacture is to use multiple pattern lithography. In an example, dummy lines (e.g., at a minimum available pitch) are formed on underlying layers for patterning and sidewall spacers are formed on and around the dummy lines. Then, the dummy lines are removed and the sidewall spacers are left on the substrate. The sidewall spacers are used as patterning masks to transfer desired patterns to the underlying layers. In this manner, line spacing at approximately half the minimum pitch can be achieved.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
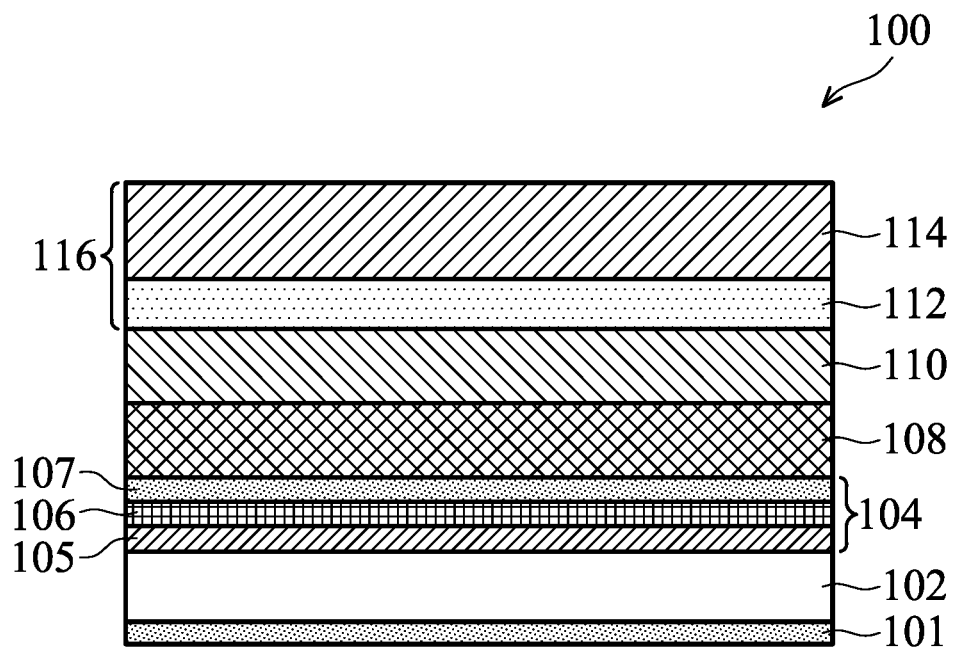
FIGS. 1-14 show various cross-sections of intermediate stages of image transfer during a semiconductor manufacturing process according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In semiconductor manufacturing, multi-layer lithography technology is used to transfer patterns of relatively small sizes. In an example, a multi-layer stack that includes at least a photoresist layer and a hard mask layer is formed on a wafer surface for image transfer. In some embodiments, the multi-layer stack includes a middle layer that is a hard mask layer, an underlying layer under the middle layer, and a photoresist layer that is above the middle layer. The underlying layer is relatively thick to form openings with a relatively high aspect ratio (e.g., depth/width of the opening). The middle layer is used to aid pattern transfer from the photoresist layer to the underlying layer, thus the thickness of the photoresist layer can be reduced. According to an aspect of the disclosure, the middle layer is selectively removed before a formation of a backfill material layer (also referred to as a reverse material layer) to fill the openings in the underlying layer. The removal of the middle layer can reduce the aspect ratio and middle layer overhang, and can improve gap-fill window to reduce defects such as void. In some embodiments, the middle layer is removed using a wet process that is tuned to selectively remove the middle layer without damaging other films, such as the underlying layer and the like. In some examples, the wet process includes a charge releasing step, an acid etching step, an alkaline etching step and a drying step. Parameters of the wet process, such as chemical concentrations, temperatures, time and the like, are tuned to reduce/avoid various defects, such as line collapse at high aspect ratio, damage to other films, voids, and the like.

A semiconductor process that uses the multi-layer lithography technology is described with reference to FIG. 1-FIG. 14 that use a double-patterning technology to split a pattern pitch formed in a lithography into two halves of the pattern pitch.

FIG. 1 shows a cross-sectional view of a portion of a semiconductor device 100 during a semiconductor manufacturing process according to some embodiments. The semiconductor device 100 includes a layer 102 that requires patterning. The layer 102 can be any suitable layer, such as a metallic layer (e.g., copper, aluminum, and the like), a dielectric layer, a polymer layer, and the like that can be patterned using photolithography and etching techniques. In an example, the layer 102 is a low-k dielectric with a smaller dielectric constant than silicon dioxide.

In the FIG. 1 example, the semiconductor device 100 includes an etch stop layer (ESL) 101 formed underneath the layer 102 and over a substrate (not shown) to aid patterning. In some embodiment, the substrate is any suitable semiconductor material, such as silicon, sapphire, germanium, gallium arsenide (GaAs), an alloy of silicon and germanium, indium phosphide (InP) and the like. The ESL 101 is formed of dielectric materials, such as silicon oxide (SiOx), silicon nitride (SiNx), silicon carbonitride (SiCxNy), silicon oxycarbide (SiCxOy), and the like. The ESL 101 can be deposited by any suitable deposition technique, such as a low pressure chemical vapor deposition (LPCVD), a plasma-enhanced chemical vapor deposition (PECVD), a plasma-enhanced atomic layer deposition (PEALD), a thermal atomic layer deposition (ALD) operation and the like.

In the FIG. 1 example, a hard mask 104 is disposed over layer 102. The hard mask 104 can be formed of any suitable material such as silicon oxynitride (SiON), silicon nitride (Si3N4), titanium nitride (TiN) and the like. In an example, the hard mask 104 includes multiple layers, such as a nitrogen free anti-reflection layer (NFARL) 105, a TiN layer 106 and a silicon oxide layer 107. In an example, the silicon oxide layer 107 is formed using tetraethyl orthosilicate (TEOS). The hard mask 104 can be formed by any suitable technique, such as chemical vapor deposition (CVD), low pressure CVD, plasma enhanced CVD, or the like. In subsequent process steps, a pattern is transferred onto the hard mask 104 using various photolithography and etching techniques. The hard mask 104 is then used as a patterning mask for etching the layer 102.

In the FIG. 1 example, a dummy layer 108 is disposed over the hard mask 104. The dummy layer 108 is used to form dummy line patterns for the formation of sidewall aligned spacers in multiple pattern lithography. The dummy layer 108 may be a polymer, an ashable hard mask (e.g., amorphous carbon film or amorphous silicon film), polysilicon, or any other material that can be patterned and selectively removed.

In the FIG. 1 example, a bottom layer 110 is formed on the dummy layer 108. The bottom layer 110 is used as a patterning mask for etching the dummy layer 108. The bottom layer 110 can be any suitable material, such as nitride and the like. In some examples, the bottom layer 110 is referred to as a hard mask. Further, in the FIG. 1 example, photoresist 116 is formed over the bottom layer 110. In the FIG. 1 example, the photoresist 116 includes a top layer 114 and a middle layer 112. In an example, the top layer 114 is a photoresist layer and the middle layer 112 includes anti-reflective material to aid exposure and focus of the top layer 114. It is noted that, in some embodiments, the bottom layer 110 is implemented using photoresist. For example, the layers 110, 112 and 114 are photoresist layers in an example.

Figure 2:
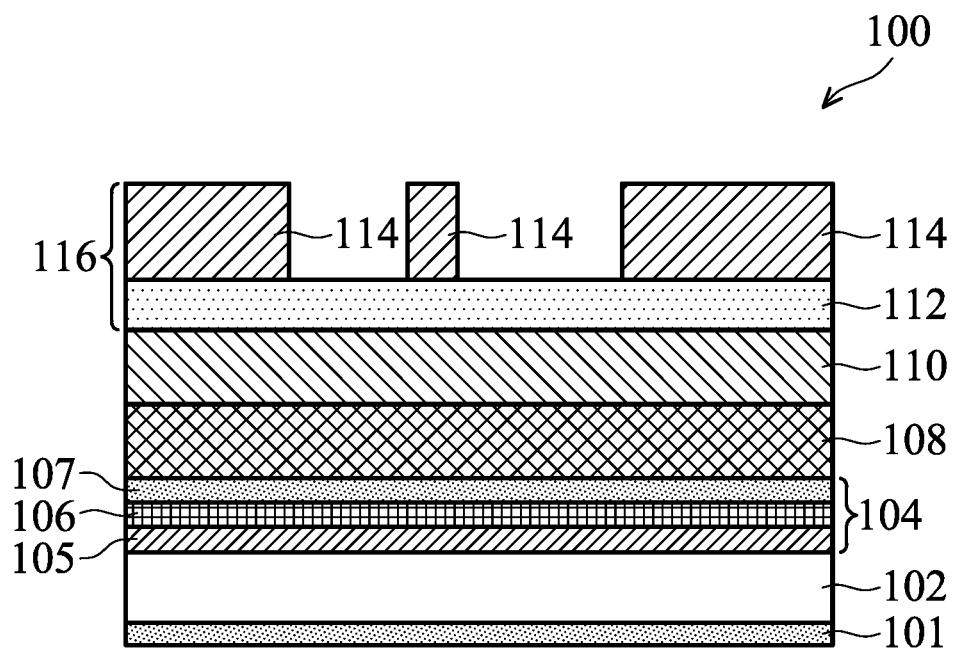

FIG. 2 shows a cross-sectional view of the semiconductor device 100 after a patterning of the top layer 114 using a suitable photolithography technique according to some embodiments. In an example, a photomask (not shown) with desired pattern features is disposed over the top layer 114. Then, the semiconductor device 100 is exposed to a radiation source, such as ultraviolet light, an excimer laser and the like. In an embodiment, exposure of the top layer 114 is performed using an immersion lithography system (e.g., a 193 nm immersion lithography system) to increase resolution and decrease the minimum achievable pitch. In another example, the exposure of the top layer 114 is performed using extreme ultraviolet lithography (EUVL). Further, in the example, the semiconductor device 100 is baked or cured to harden the top layer 114, and the top layer 114 is developed to remove either the exposed or unexposed portions of the top layer 114 depending on whether the top layer 114 is positive photoresist or negative photoresist. Thus, a pattern, such as shown in FIG. 2, is formed in the top layer 114. The patterned portions of top layer 114 are spaced apart from each other at pitches. In an example, the minimum of the pitches is determined based on a photolithographic system used to create the pattern. It is noted that the pattern of the top layer 114 in FIG. 2 is for illustrative sake, and other patterns can be formed depending on the design of semiconductor device 100.

Figure 3:
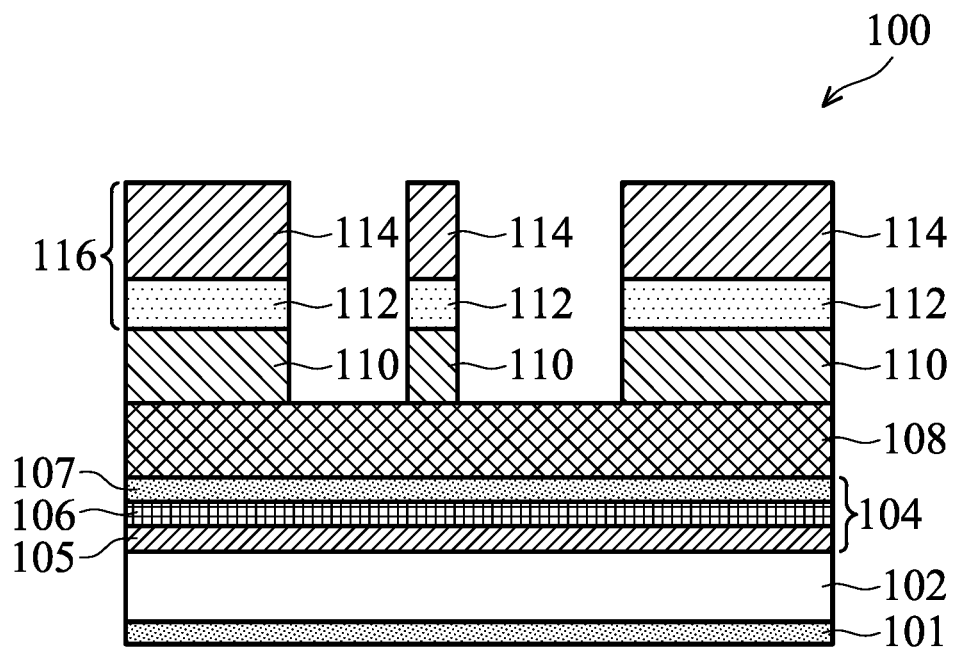

FIG. 3 shows a cross-sectional view of the semiconductor device 100 after a pattern transferring of the pattern in the top layer 114 to the middle layer 112 and the bottom layer 110 according to some embodiments. In an example, the pattern is transferred using a selective etch process, such as anisotropic plasma etch process and the like to remove portions of the middle layer 112 and the bottom layer 110 according to the pattern in the top layer 114.

Figure 4:
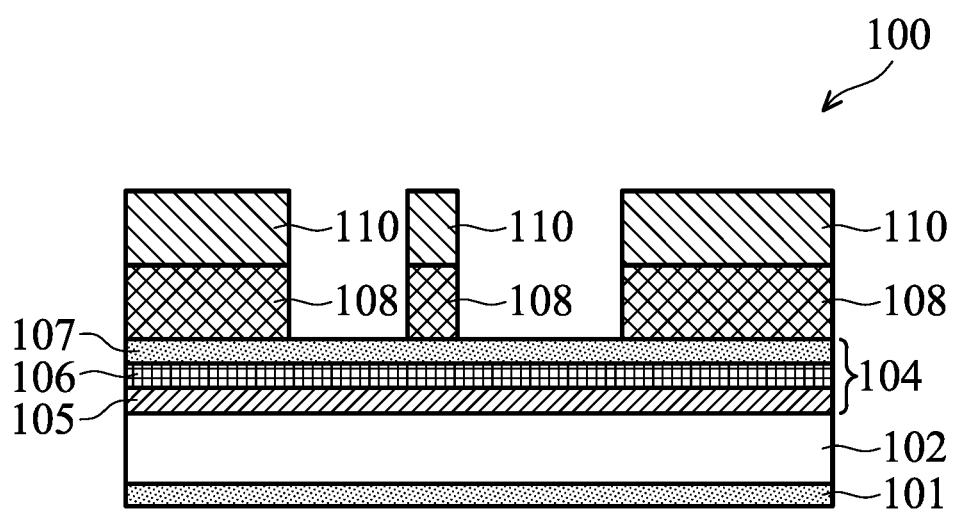

FIG. 4 shows a cross-sectional view of the semiconductor device 100 after a pattern transferring of the pattern to the dummy layer 108 according to some embodiments. In an example, the pattern is transferred using a selective etch process, such as anisotropic plasma etch process to remove portions of the dummy layer 108 according to the pattern in middle layer 112 and the bottom layer 110 to form dummy lines, that are referred to as mandrels, in the dummy layer 108. Then, the top layer 114 and middle layer 112 are removed, for example using an etching process.

Figure 5:
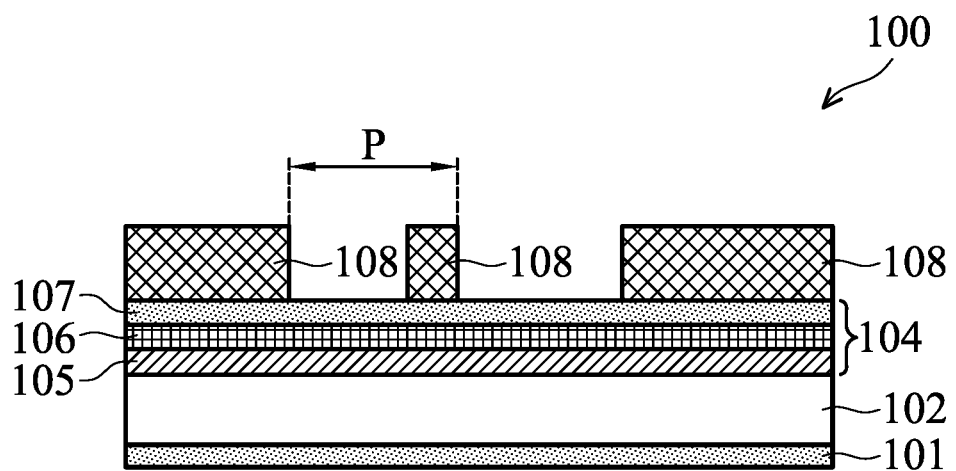

FIG. 5 shows a cross-sectional view of the semiconductor device 100 after a removal of the bottom layer 110 according to some embodiments. In an example, the bottom layer 110 is removed using an ashing process. In the FIGS. 1-14 example, the dummy lines in the dummy layer 108 have different widths. It is noted that, in some examples, the dummy lines in the dummy layer 108 are evenly spaced to have relatively uniform pattern density.

Figure 6:
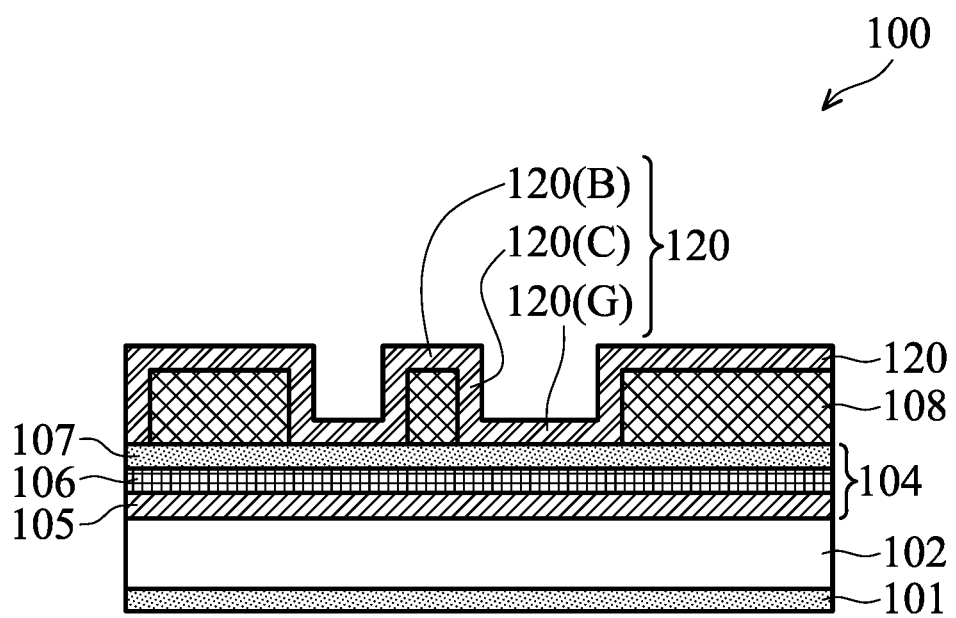

FIG. 6 shows a cross-sectional view of the semiconductor device 100 after a formation of a spacer layer 120 according to some embodiments. In an example, the spacer layer 120 is formed on various surfaces, such as bottom areas between the dummy lines shown as 120(A), top areas of the dummy lines shown as 120(B), and sidewalls of the dummy lines shown as 120(C). The spacer layer 120 is self-aligned with the dummy lines in the dummy layer 108. The portions of the spacer layer 120 that are formed on the sidewalls of the dummy lines are referred to as spacers. In some examples, the spacer layer 120 is conformably formed over the various surfaces (e.g., bottom areas between the dummy lines, top areas of the dummy lines, and sidewalls of the dummy lines), thus thickness of the spacer layer 120 over the various surfaces are about the same. The spacer layer 120 can be formed using a suitable deposition process, such as atomic layer deposition (ALD), CVD, low pressure CVD, and the like.

In some embodiments, material of the spacer layer 120 has a high etch selectivity over other materials that are deposited in subsequent patterning steps (e.g., illustrated in FIGS. 7-14). For example, an etch rate of the other materials to an etch rate of the material of the spacer layer 120 is greater than for example, 5. Thus, in the example, etching steps to remove the other materials remove insignificant amount of the spacer layer 120. For example, a ratio of a thickness of the removed portions of the spacer layer 120 in an etch process (that etch the other material that are deposited in the subsequent patterning steps) to the original thickness of the spacer layer 120 is smaller than a predetermined threshold and can be neglected. In some examples, the spacer layer 120 is formed of titanium nitride (TiN), titanium oxide (TiO), and the like, and is referred to as a high selectivity spacer.

Figure 7:
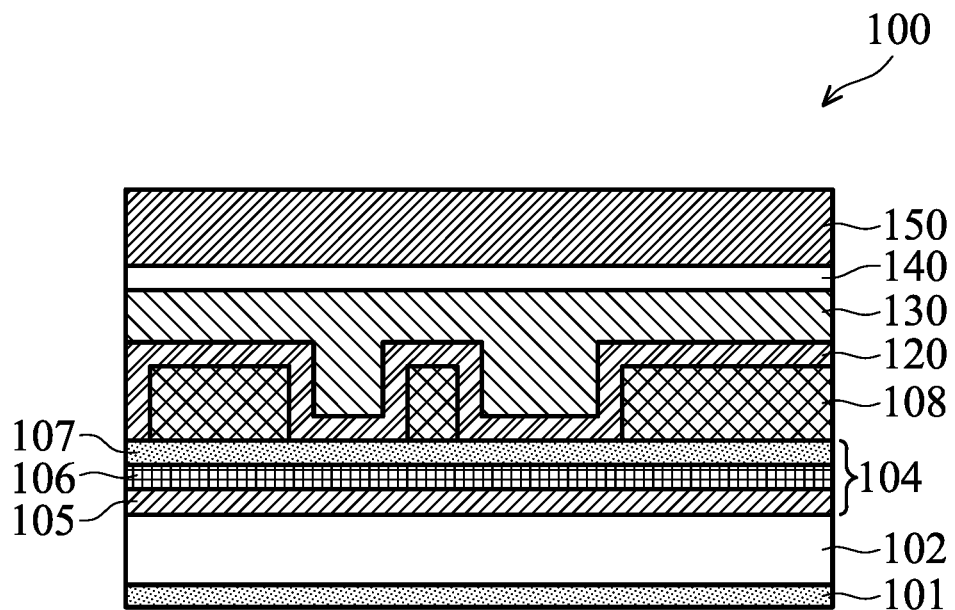

FIG. 7 shows a cross-sectional view of the semiconductor device 100 after a formation of a multi-layer photolithography stack according to some embodiments. In some examples, the multi-layer photolithography stack is a tri-layer stack that includes a bottom layer 130, a middle layer 140 and a top layer 150.

In some examples, the bottom layer 130 is a carbon rich material. In an example, the bottom layer 130 is spin-on carbon (SOC) based film that is formed using a spin-on hard mask technology. In some examples, the middle layer 140 is a silicon based hard mask that is formed on the bottom layer 130 using the spin-on hard mask technology. In some embodiments, the silicon concentration of the middle layer 140 is in the range from 13% to 50% and the carbon concentration of the bottom layer 130 is in the range from 50% to 90% depending on the technology requirement. The silicon based middle layer 140 increases a selectivity of the bottom layer 130 during etching. Further, in some examples, the top layer 150 is a photoresist layer.

In an example, the bottom layer 130 is relatively thick and in a range of 30 to 200 nm. The middle layer 140 is used to aid pattern transfer into the bottom layer 130, thus relatively thin photoresist layer, for example, the top layer 150 can be used. The thinner photo resist layer provides various benefits, such as a reduction of resist adhesion to substrate to prevent collapse. In an example, the middle layer 140 has a thickness in a range of 4 to 40 nm. However, these thicknesses are meant to be illustrative only, and are not intended to limit the scope of the embodiments.

Figure 8:
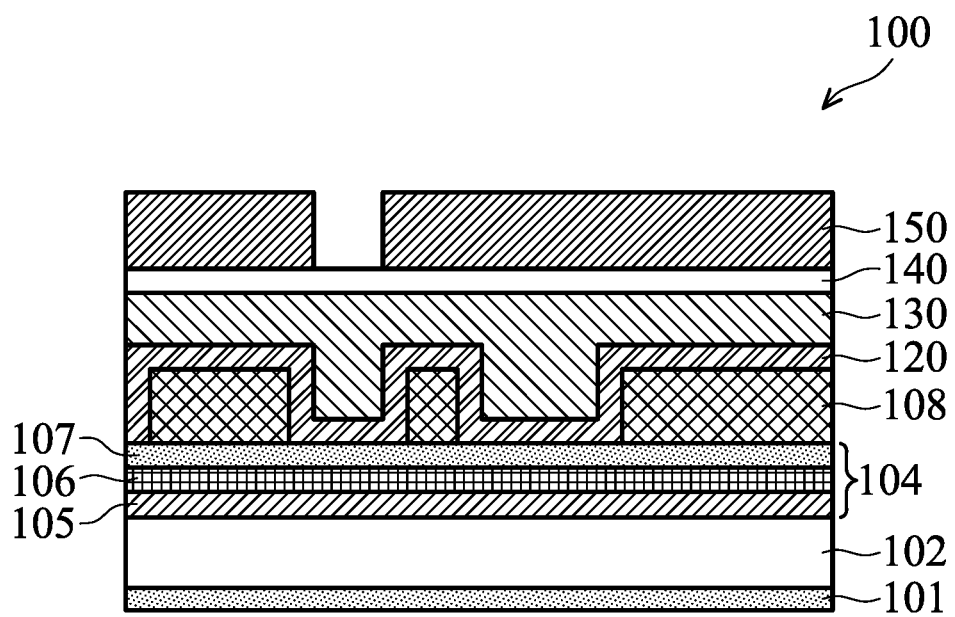

FIG. 8 shows a cross-sectional view of the semiconductor device 100 after a patterning of the top layer 150 according to some embodiments. In some examples, the patterning of top layer 150 is achieved, for example, using a suitable photolithography system (e.g., an extreme ultraviolet lithography (EUVL) system) to expose portions of the top layer 150 and developing the exposed/unexposed portions depending on whether a positive/negative photoresist is used.

Figure 9:
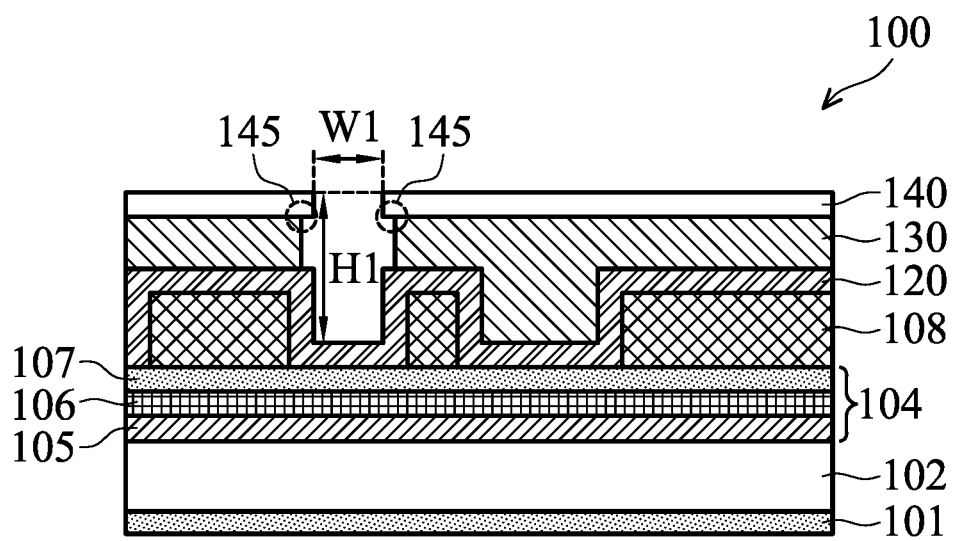

FIG. 9 shows a cross-sectional view of the semiconductor device 100 after a pattern transfer from the top layer 150 to the middle layer 140 and the bottom layer 130 according to some embodiments. In an example, the middle layer 130 is etched using the top layer 150 as a mask and the bottom layer 130 is etched using the top layer 150 and the middle layer 140 as a mask. In addition, a chemical etchant can be selected to etch the bottom layer 130, without significantly etching the spacer layer 120. In an example, tetrafluoromethane ($CF_4$) is used to selectively etch the bottom layer 130 (C-rich material) without significantly etching the spacer layer 120, because $CF_4$ does not significantly attack the higher selectivity material of the spacer layer 120 (e.g., TiN or TiO). In an example, when the bottom layer 130 is etched, the top layer 150 is simultaneously etched away. Thus, after the etching, the top layer 150 has been removed as a result of the etching. It is noted that, in some example, after the etching process, the opening of the middle layer 140 is smaller than the opening of the bottom layer 130, thus the middle layer 140 overhangs the bottom layer 130 at the opening as shown by 145.

Figure 10:
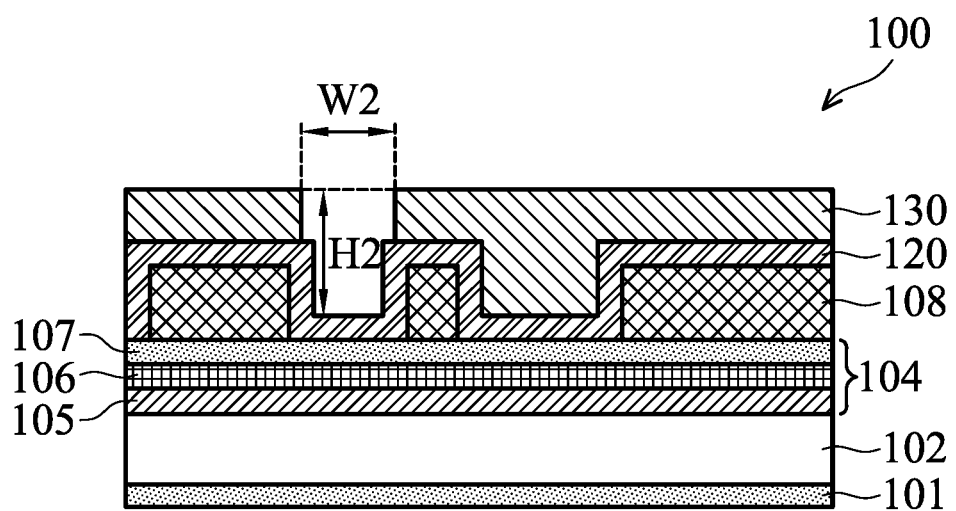

FIG. 10 shows a cross-sectional view of the semiconductor device 100 after a removal of the middle layer 140 according to some embodiments. In some examples, the removal of the middle layer 140 reduces an aspect ratio of an opening (e.g., height of the opening over a width of the opening). For example, the aspect ratio prior to the removal of the middle layer 140, as shown in FIG. 9, can be represented as H1/W1, and the aspect ratio after the removal of the middle layer 140, as shown in FIG. 10, can be represented as H2/W2. H1 is the depth of the opening prior to the removal of the middle layer 140 as shown in FIG. 9, and H2 is the depth of the opening after the removal of the middle layer 140 as shown in FIG. 10. W1 is the width of the opening prior to the removal of the middle layer 140 as shown in FIG. 9, and W2 is the width of the opening after the removal of the middle layer 140 as shown in FIG. 10. In an example, W2 is about 1 to 5% large than W1 due to middle layer overhang, and H2 is about 10% smaller than H1, thus the aspect ratio is reduced by about 10~15% for example.

According to an aspect of the disclosure, a wet process is used to remove the middle layer 140 and parameters of the wet process are tuned to reduce various defects. In an embodiment, the wet process includes four steps that can be performed by one station sequentially. The wet process will be described in detail with reference to FIG. 15.

Figure 11:
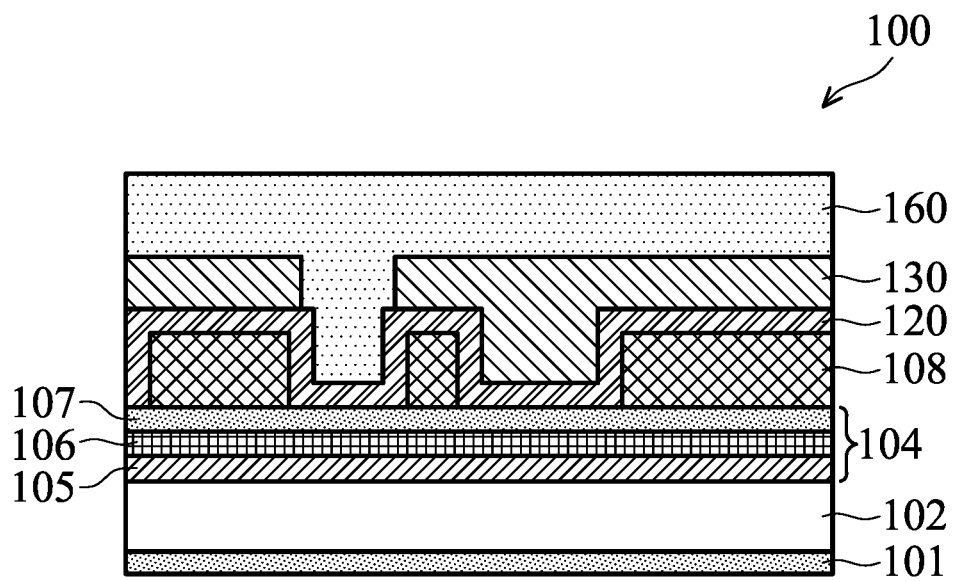

FIG. 11 shows a cross-sectional view of the semiconductor device 100 after a back fill of a backfill material layer 160 according to some embodiments. The backfill material layer 160 fills in openings in the bottom layer 130. In some embodiments, the backfill material layer 160 is of similar material as the bottom layer 130, such as carbon rich film. In an example, the backfill material layer 160 is formed of spin-on carbon rich film using spin-on technology. In some other embodiments, the backfill material layer 160 is an oxide film formed using atomic layer deposition (ALD). However, any suitable material and any suitable process may be used to form the backfill material layer 160. The removal of the middle layer 140 reduces the aspect ratio of the openings and overhang of middle layer, which can improve gap fill window and reduce possibility of void formation.

Figure 12:
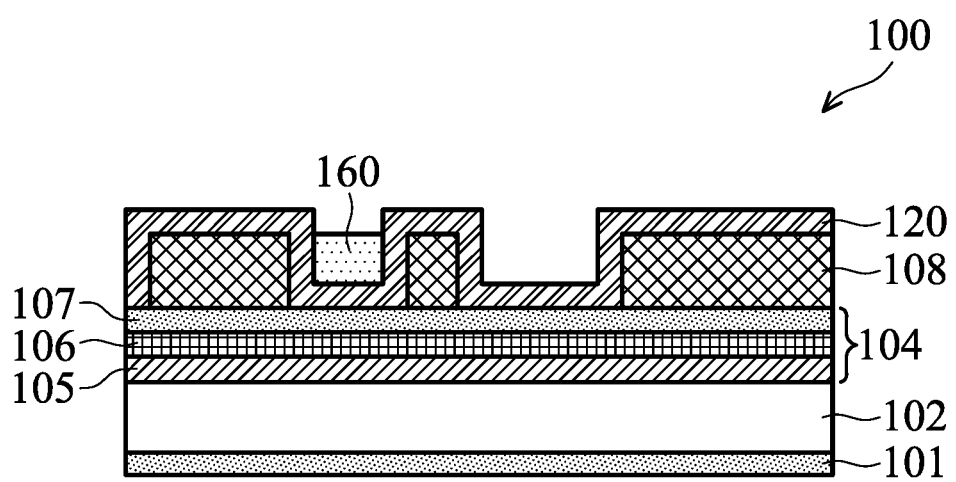

FIG. 12 shows a cross-sectional view of the semiconductor 100 after an etch back of the backfill material layer 160. The etch back of top portions of backfill material layer 160 and the bottom layer 130 exposes top surfaces of the spacer layer 120, and is performed, for example, using an anisotropic etching technique. It is noted that a top surface of the remaining backfill material layer 160 may be lower than, and not level with, a top surface of spacer 120.

Figure 13:
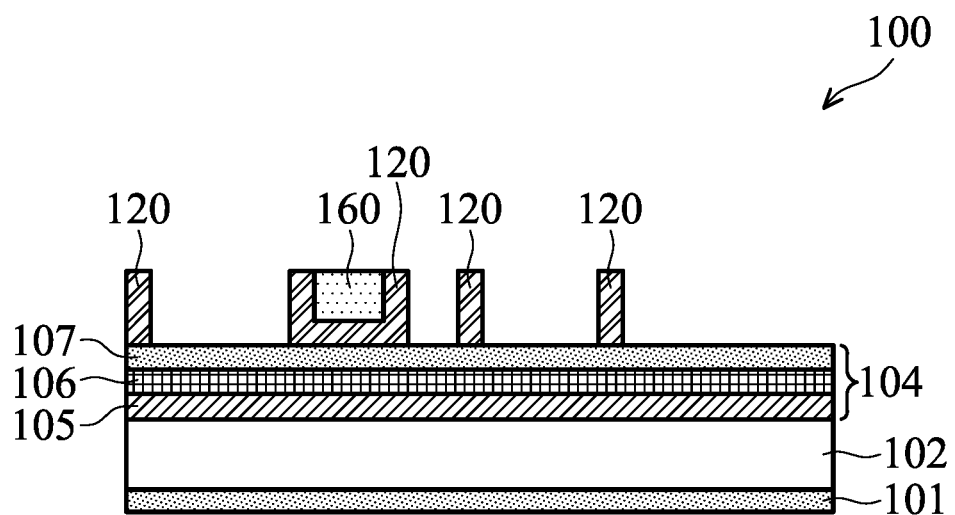

FIG. 13 shows a cross-sectional view of the semiconductor 100 after an etch back of the spacer layer 120 and a removal of dummy lines. In the FIG. 13 example, top portions of the spacer layer 120 is anisotropically etched to expose underlying dummy lines and hard mask 104. The chemical etchant used to etch the spacer layer 120 is selected based on the higher selectivity spacer material. For example, top surfaces of the spacer layer 120 are etched using chlorine as an etchant. Dummy lines may be removed using, for example, an oxygen-plasma ashing process. Subsequently, a wet clean process can be applied to the semiconductor device 100 to remove residual spacer and dummy layer material. The remaining portions of the spacer layer 120 and backfill material layer 160 form a mask for transferring a pattern into the hard mask 104.

It is noted that the procedures shown with reference to FIG. 7-FIG. 13 can be repetitively used to form more complex patterns using the spacer layer 120 and backfill material layers.

Figure 14:
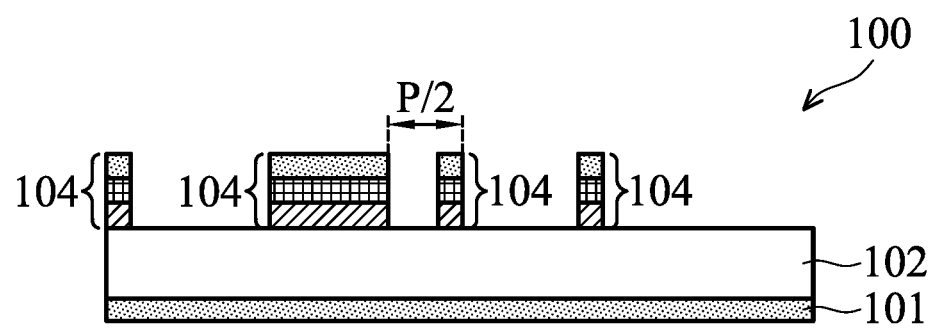

FIG. 14 shows a cross-sectional view after a pattern transferring in the hard mask 104 according to some embodiments of the disclosure. The hard mask 104 is patterned using the pattern formed by the spacer layer 120 and the backfill material layer 160 as a mask. Any suitable chemical, for example, $CF_4$ may be used to etch the hard mask 104. In a subsequently process step (not shown), the hard mask 104 can be used to transfer the pattern to the layer 102, for example, through an etching process using the hard mask 104 as a patterning mask.

It is noted that the pattern of the hard mask 104 can be spaced at about half the pitch of the dummy lines 108. For example, a minimum pitch P (e.g., 80 nm) was used to pattern dummy lines 108 as shown in FIG. 5. Then, the features of the hard mask 104 is spaced at about half the minimum pitch P/2 (e.g., 40 nm), as shown in FIG. 14. Thus, through the use of the steps illustrated in FIGS. 1-14, a hard mask is patterned with a relatively high resolution and relatively small pitch.

Figure 15:
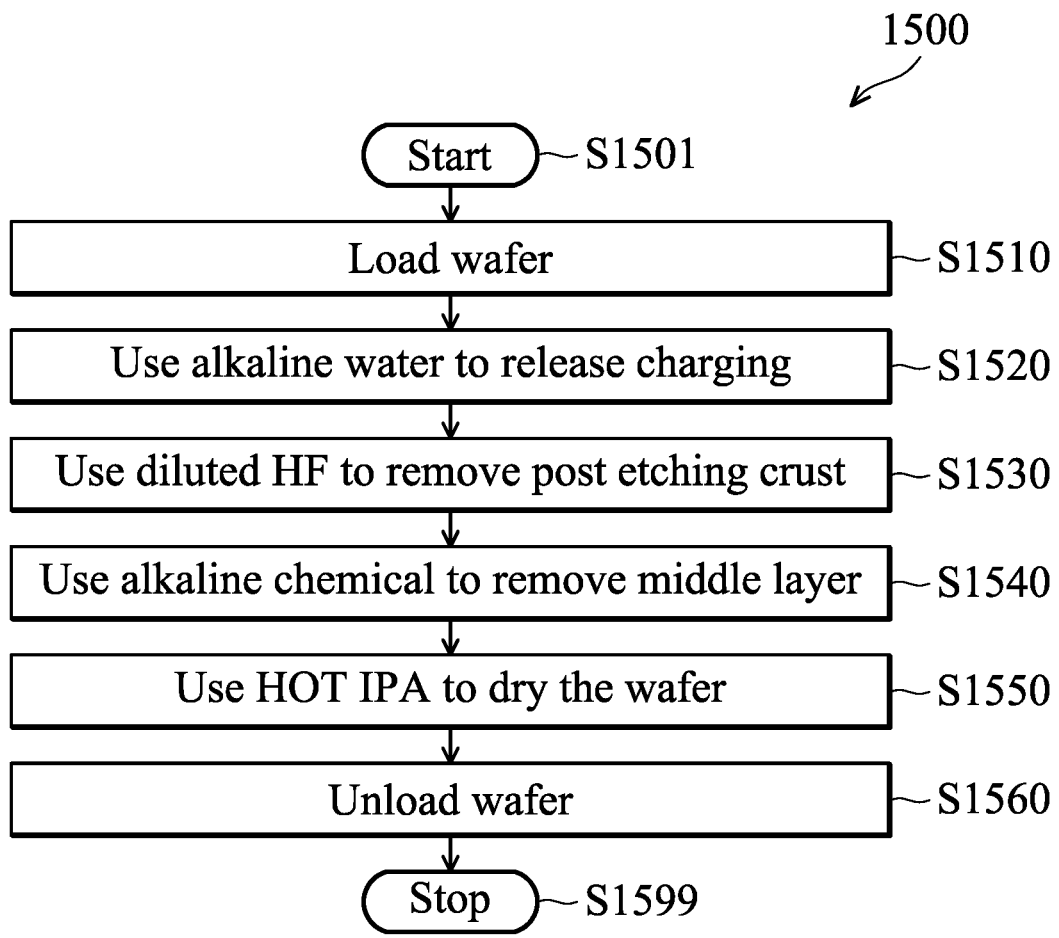
FIG. 15 shows a flow chart outlining a wet process example according to some embodiments of the disclosure.

FIG. 15 shows a flow chart outlining a wet process example according to some embodiments of the disclosure. In an example, the wet process is used on the semiconductor device 100 after FIG. 9 to form the cross section shown in FIG. 10. The process starts at S1501, and proceeds to S1510.

At S1510, a wafer is loaded in a wet station. In an example, the wet station is a single wafer processing equipment, and wafers are loaded and processed one by one in the wet station. In some examples, inside the wet station, a wafer chuck is used to hold a wafer in place during processing. The wafer chuck can rotate at a chuck speed, and can include heating elements to heat the wafer to certain temperature.

At S1520, discharging solution is applied to the wafer to release charging. In some examples, electronic charges are left on the wafer surface due to, for example, a plasma processing step, a use of electrostatic chuck and the like. The electronic charges can cause etching rate variation and affect etching rate controllability. In an example, when a relatively large amount of electronic charges are left on a portion of the wafer surface, the etching rate at the portion of the wafer surface is relatively high in the following wet process, such as the acid etching step, the alkaline etching step, and the like, and relatively large loss of the spacer layer (e.g., TiO film) can happen at the portion of the wafer surface. In this step, the wafer is treated with discharging solution to release charging. After the discharging solution treatment to release charges from wafer, the loss of the spacer layer (e.g., TiO film) can be reduced during the following wet process. The discharging solution includes ions and is conductive, thus electronic charges can be released by the discharging solution. The discharging solution can be acidic solution or alkaline solution. In some embodiments, acidic solution, such as carbonic acid (e.g., carbonated water, a solution of carbon dioxide in water), diluted citric acid, and the like is used when the wet process is used in the front end of line (FEOL) of IC fabrication. In some embodiments, alkaline solution, such as a basic aqueous solution, is used when the wet process is used in the back end of line (BEOL) of IC fabrication. In some examples, the basic aqueous solution includes ammonium hydroxide ($NH_4OH$) or ammonia ($NH_3$). In an example, diluted $NH_4OH$ is used and the concentration of $NH_4OH$ is in a range from 3 to 40 ppm. In some embodiments, the treat time of the discharging solution is in a range of 10 seconds to 240 seconds. In some embodiment, the temperature of discharging solution step is room temperature, such as in a range of 20° C. to 30° C. In some embodiments, flow of discharging solution is in a range of 800 to 1500 standard cubic centimeters per minutes (sccm), for example 1000 sccm The chuck speed is in a range of 200 to 1000 revolutions per minute (rpm), for example 200 rpm.

At S1530, a diluted HF solution is used to remove post etching crust. In an example, the previous plasma etch process may leave post-etch crust that is the debris of the plasma etch process, and has a composition of polymer. The post-etch crust can affect the removal of the middle layer under the crust, thus the middle layer may not be completely removed. The diluted HF solution can effectively remove post-etch crust without damaging the bottom layer 130 and the spacer layer 120 if surface charging is released at S1520 and suitable conditions of the diluted HF solution are selected. The use of the diluted HF solution can reduce process time for alkaline chemical step that removes the middle layer 140. In some embodiments, the volume concentration of the diluted HF solution is in a range from 100:1 to 2000:1. In some embodiments, the process time is in a range from 10 seconds to 60 seconds. In some embodiments, the temperature of diluted HF process is room temperature, such as in a range of 20° C. to 30° C. In some embodiments, the flow of the diluted HF solution is in a range of 1000 to 2000 sccm. The chuck speed is in a range of 300 to 1000 rpm.

At S1540, alkaline etchant is used to remove the middle layer, such as the middle layer 140 in FIG. 9. In some embodiments, the alkaline etchant includes at least one solvent and at least one basic solute. The solvent can be an organic solvent, such as ethylene glycol, diethylene glycol, diethylene glycol monoethyl ether, diethylene glycol monobutyl ether, propylene glycol, dipropylene glycol monomethyl ether, propylene glycol monomethyl ether, dimethylsulfoxide or can include a mixture of two or more of the above organic solvents. In some embodiments, the alkaline etchant can be an alkaline solution with both an organic solvent and water. The base solute can be ammonium hydroxide, tetramethylammonium hydroxide, tetraethylammonium hydroxide, ethanolamine, diethanolamine, sodium hydroxide, potassium hydroxide or a mixture of two or more of the above base solutes. Parameters of the step are tuned to remove the middle layer 140 and reduce damage to the bottom layer 130 and the spacer layer 120. In some embodiments, base concentration of the alkaline etchant is in a range of 0.4% to 5% (weight percentage), inhibitor concentration of the alkaline etchant is in a range of 0.01% to 1% (weight percentage) to protect the spacer material, the organic polar solvent concentration of the alkaline etchant is in a range of 8% to 85% (weight percentage), and the water concentration is in a range of 15% to 90% (weight percentage) to well soluble inhibitor and form a suitable surface tension which can sustain a certain wetting ability to the middle layer and bottom layer. However, any suitable ratio of organic solvent and water can be used. The temperature is in a range from 40° C. to 60° C. The process time is in a range from 30 seconds to 180 seconds. In some embodiments, flow of alkaline chemical is in a range of 1000 to 2000 sccm. The chuck speed is in a range of 200 to 800 rpm.

At S1550, hot isopropyl alcohol (IPA) is used to dry the wafer. In an example, the hot IPA process reduces surface tension of liquids on the wafer surface compared to other drying process, such as spin drying, N2 drying and the like. Such liquids may include solvent(s) used in preceding processes, such as the alkaline chemical etching process at S1540. Surface tension is one of the reasons for pattern collapse. For example, capillary forces caused by surface tension of water can pull lines towards each other, leading to line collapse. Thus, by reducing the surface tension of the liquids on the wafer, the hot IPA process can prevent pattern collapse. In some examples, the hot IPA is dispersed over the wafer, and the wafer chuck spins and heats the wafer to dry the wafer. In some embodiments, the temperature of the hot IPA is in a range of 40° C. to 80° C., and the process time is in a range from 30 seconds to 150 seconds. In some embodiments, flow of the hot IPA is in a range of 100 to 800 sccm. The chuck speed is about 300 to 1200 rpm.

At S1560, the wafer is unloaded. Then the process proceeds to S1599 and terminates.

In some embodiments, experiments are designed to determine optimal process parameters. In an example, an optimal alkaline chemical time range is determined based on experiment. When the alkaline chemical time is below the optimal alkaline chemical time range, the middle layer 140 is not completely removed; and when the alkaline chemical time is above the optimal alkaline chemical time range, the bottom layer 130 becomes soft due to prolonged solvent soaking time, and may collapse in the drying step.

It is noted that, in some embodiments, the step S1530 can be executed before the step S1520. In some embodiments, the wet process can include a first diluted HF etching step before the discharging solution step (S1520), and a second diluted HF etching step after the discharging solution step (S1520).

Figure 16:
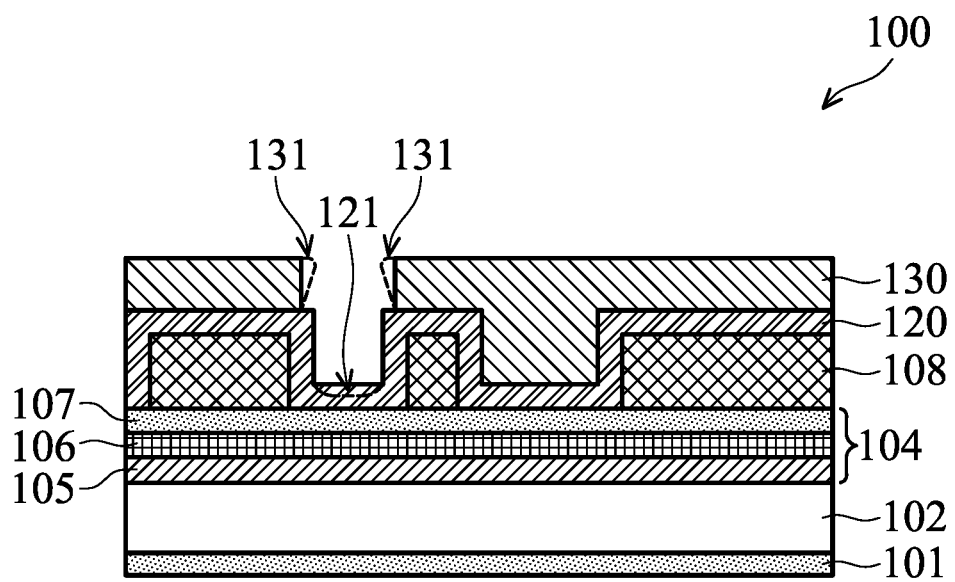
FIGS. 16-17 show potential defect locations and types according to some embodiment of the disclosure.
Figure 17:
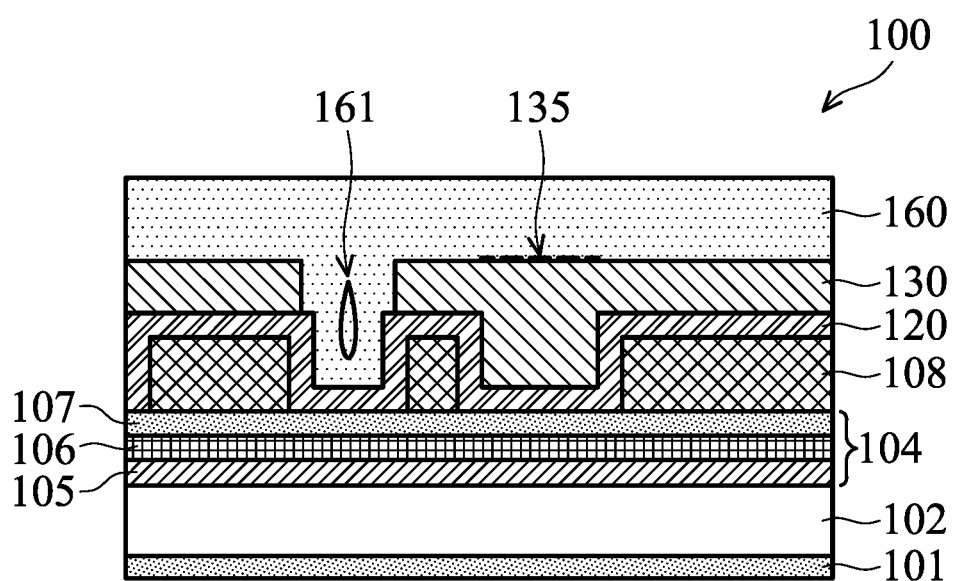

FIGS. 16-17 show benefits of wet process that removes the middle layer and reduce/avoid various defects according to some embodiments of the disclosure.

FIG. 16 is similar to FIG. 10, the description of which is provided above and omitted here for simplicity. In the FIG. 16 example, line collapse can happen at locations shown as 131. For example, adjacent structures of the bottom layer at locations 131 in FIG. 16 can be pulled towards each other due to surface tension. The hot IPA can reduce surface tension of liquid on the device surface, and is used to avoid degradation of strength of the bottom layer 130 after the solvent soaking in the alkaline chemical step (S1540). Further, in the FIG. 16 example, TiO damage can happen at locations shown as 121. For example, the TiO film is thinner at locations 121 due to TiO damage. In an example, the treat time of the alkaline chemical step (S1540) is optimized to avoid the TiO damage.

FIG. 17 is similar to FIG. 11, the description of which is provided above and omitted here for simplicity. In FIG. 17 example, voids generally happen at locations shown as 161. According to an aspect of the disclosure, the removal of the middle layer 140 enlarges the gap fill window, and reduces aspect ratio, and can reduce possibility of void formation. Further, in the FIG. 17 example, remaining middle layer material, such as material of the middle layer 140 in FIG. 9, can be left at locations shown as 135 due to for example surface charging, surface crust and the like. In an example, discharging solution treatment (S1520) and the diluted HF treatment (S1530) before the alkaline etchant step are applied to release surface charging and remove crust, thus possibility of remaining middle layer can be reduced.

Aspects of the disclosure provide a method. The method includes providing a substrate having a structure formed on the substrate, and forming a spacer layer on the structure. Then, the method includes forming a mask layer over the spacer layer. The mask layer includes a first layer, a second layer over the first layer, and a third layer over the second layer. Further, the method includes patterning the third layer of the mask layer, and etching the first layer and the second layer of the mask layer with a dry etching process using the third layer as an etch mask to form an opening that exposes a portion of the spacer layer. Then, the method includes removing the second layer using a wet etchant before a formation of a backfill material layer in the opening and over the first layer.

Aspects of the disclosure provide another method. The method includes providing a substrate having a structure formed on the substrate and forming a spacer layer on the structure. Then, the method includes forming a mask layer over the spacer layer. The mask layer includes a bottom layer, a middle layer over the bottom layer, and a top layer over the middle layer. Then, the method includes patterning the top layer of the mask layer and etching the middle layer and the bottom layer of the mask layer with a dry etching process using the top layer as an etch mask to form an opening that exposes a portion of the spacer layer. Further, the method includes treating the substrate with a solution with ions that releases charges from the exposed portion of the spacer layer, and removing the middle layer using a wet etchant before a formation of a backfill material layer in the opening and over the bottom layer.

Aspects of the disclosure provide another method. The method includes providing a substrate having a structure formed on the substrate, and forming a spacer layer on the structure. Further, the method includes forming a first layer over the spacer layer and forming a second layer over the first layer. The first layer and the second layer include silicon and carbon. A carbon content of the first layer is higher than the second layer, and a silicon content of the first layer is lower than the second layer. Then the method includes forming a photoresist layer over the second layer, patterning the photoresist layer, and etching the first layer and the second layer with a dry etching process using the photoresist layer as an etch mask to form an opening that exposes a portion of the spacer layer. Further, the method includes removing the second layer using a wet etchant before a formation of a backfill material layer in the opening and over the first layer.

In some embodiments, a method is provided. The method includes providing a substrate having a structure formed on the substrate, and forming a spacer layer on the structure. The method includes forming a mask layer over the spacer layer, the mask layer comprising a first layer, a second layer over the first layer, and a third layer over the second layer. The method also includes patterning the third layer of the mask layer, and etching the first layer and the second layer of the mask layer to form an opening to expose a bottom surface of the second layer. The method further includes removing the second layer using a wet etchant.

In some embodiments, a method is provided. The method includes providing a substrate having a structure formed on the substrate, and forming a spacer layer on the structure. The method also includes forming a mask layer over the spacer layer, the mask layer comprising a bottom layer, a middle layer over the bottom layer, and a top layer over the middle layer. The method further includes patterning the top layer of the mask layer, and etching the middle layer and the bottom layer of the mask layer to form a first opening through the bottom layer and a second opening through the middle layer. The first opening includes a first sidewall, the second opening comprises a second sidewall, and the first sidewall is not aligned with the second sidewall. The method includes removing the middle layer.

In some embodiments, a method is provided. The method includes providing a substrate having a structure formed on the substrate, and forming a spacer layer on the structure. The method also includes forming a mask layer over the spacer layer, the mask layer comprising a bottom layer, a middle layer over the bottom layer, and a top layer over the middle layer. The method includes patterning the top layer of the mask layer, and etching the middle layer and the bottom layer of the mask layer to form an opening. The method includes removing the middle layer, and forming a backfill material in the opening, wherein the backfill material has a step-shaped sidewall surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    providing a substrate having a structure formed on the substrate;
    forming a spacer layer on the structure;
    forming a mask layer over the spacer layer, the mask layer comprising a first layer, a second layer over the first layer, and a third layer over the second layer, wherein the first layer comprises a first silicon content and a first carbon content, the second layer comprises a second silicon content and a second carbon content, and the first carbon content is higher than the second carbon content, and the first silicon content being lower than the second silicon content;
    patterning the third layer of the mask layer;
    etching the first layer and the second layer of the mask layer to form an opening to expose a bottom surface of the second layer; and
    removing the second layer using a wet etchant.

2. The method of claim 1, wherein removing the second layer using the wet etchant comprises:
    removing the second layer using the wet etchant that comprises a base solute in a mixture of organic solvent and water.

3. The method of claim 1, further comprising:
    pre-treating the substrate with a discharging solution before removing the second layer.

4. The method of claim 3, wherein:
    pre-treating the substrate with a basic aqueous solution or the acidic aqueous solution before removing the second layer.

5. The method of claim 1, further comprising:
    pre-treating the substrate with a hydrogen fluoride (HF) solution before removing the second layer.

6. The method of claim 1, further comprising:
    forming a backfill material in the opening after removing the second layer; and
    etching a portion of the backfill material and the first layer to expose a top surface of the spacer layer.

7. The method of claim 6, wherein a top surface of the backfill material is lower than a top surface of the spacer layer after etching the portion of the backfill material and the first layer.

8. The method of claim 6, wherein a void is formed in the backfill material.

9. The method of claim 1, where forming the mask layer over the spacer layer further comprises:
    forming the third layer that is a photoresist layer.

10. The method of claim 1, further comprising:
    dispersing isopropyl alcohol (IPA) over the substrate; and
    drying the substrate by spinning and heating the substrate.

11. A method, comprising:
    providing a substrate having a structure formed on the substrate;
    forming a spacer layer on the structure;
    forming a mask layer over the spacer layer, the mask layer comprising a bottom layer, a middle layer over the bottom layer, and a top layer over the middle layer;
    patterning the top layer of the mask layer;
    etching the middle layer and the bottom layer of the mask layer to form a first opening through the bottom layer and a second opening through the middle layer, wherein the first opening comprises a first sidewall, the second opening comprises a second sidewall, and the first sidewall is not aligned with the second sidewall; and
    removing an entirety of the middle layer; and
    forming a backfill material in the first opening after removing the entirety of the middle layer.

12. The method of claim 11, further comprising:
    etching a portion of the backfill material and the bottom layer to expose a top surface of the spacer layer.

13. The method of claim 12, wherein the backfill material has a step-shaped sidewall surface.

14. The method of claim 11, wherein a width of the first opening is wider than a width of the second opening.

15. The method of claim 11, further comprising:
    pre-treating the substrate with a discharging solution before removing the middle layer.

16. The method of claim 11, further comprising:
    treating the substrate with a hydrogen fluoride (HF) solution before removing the middle layer.

17. A method, comprising:
    providing a substrate having a structure formed on the substrate;
    forming a spacer layer on the structure;
    forming a mask layer over the spacer layer, the mask layer comprising a bottom layer, a middle layer over the bottom layer, and a top layer over the middle layer;
    patterning the top layer of the mask layer;
    etching the middle layer and the bottom layer of the mask layer to form an opening;
    removing the middle layer to expose a top surface of the bottom layer; and
    forming a backfill material in the opening and on the top surface of the bottom layer, wherein the backfill material has a step-shaped sidewall surface.

18. The method of claim 17, further comprising:
    etching a portion of the backfill material and the bottom layer to expose a top surface of the spacer layer, wherein a top surface of the backfill material is lower than a top surface of the spacer layer after etching the portion of the backfill material and the bottom layer.

19. The method of claim 17, further comprising:
    treating the substrate with a hydrogen fluoride (HF) solution before removing the middle layer.

20. The method of claim 17, wherein a void is formed in the backfill material.

* * * * *